United States Patent [19]

Takahashi et al.

[11] Patent Number: 4,934,820
[45] Date of Patent: Jun. 19, 1990

[54] SEMICONDUCTOR DEVICE

[75] Inventors: Yasushi Takahashi, Tachikawa; Kazuyuki Miyazawa, Iruma; Hidetoshi Iwai, Ohme; Masaya Muranaka, Akishima, all of Japan

[73] Assignees: Hitachi, Ltd.; Hitachi VLSI Engineering Corp., both of Tokyo, Japan

[21] Appl. No.: 256,862

[22] Filed: Oct. 12, 1988

[30] Foreign Application Priority Data

Oct. 20, 1987 [JP]   Japan ................... 62-264679

[51] Int. Cl.⁵ ............... H01L 23/48; H01L 29/44; H01L 27/10; H02G 13/08
[52] U.S. Cl. ................... 357/70; 357/68; 357/45; 357/74; 174/52.4
[58] Field of Search ............. 357/70, 68, 45; 174/52.4

[56] References Cited

U.S. PATENT DOCUMENTS 4,595,945  6/1986  Graver ................... 357/68
4,612,564  9/1986  Moyer ................... 357/70
4,688,072  8/1987  Heath et al. ........... 357/45

FOREIGN PATENT DOCUMENTS 009134   1/1985  Japan ................... 357/70
43849    3/1985  Japan .
167454   8/1985  Japan .
218139   9/1986  Japan .

Primary Examiner—Rolf Hille
Assistant Examiner—Robert P. Limanek
Attorney, Agent, or Firm—Antonelli, Terry, Stout & Kraus

[57]  ABSTRACT

According to the present invention, a semiconductor chip is mounted on a zigzag in-line type package (ZIP) partially using a tabless lead frame and bonding pads are arranged on the chip so that the chip can be applied also to other different types of packages. As different types of packages there are a small out-line J-bent type package (SOJ) for which there is used a lead frame with tab and a dual in-line type package (DIP) for which there is used a tabless lead frame. Further, a plurality of bonding pad pairs are provided among the bonding pads on the chip each pad of such bonding pad pairs having the same function as the other pad associated therewith thereby duplicating a common function in different bonding pads on the semiconductor chip so as to readily facilitate, or make compatible, the semiconductor chip to a variety of or different types of packages.

10 Claims, 8 Drawing Sheets

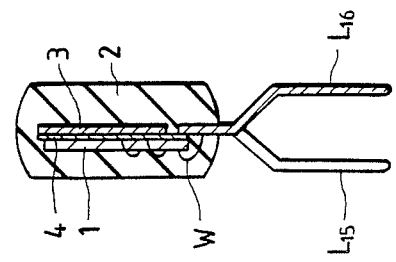
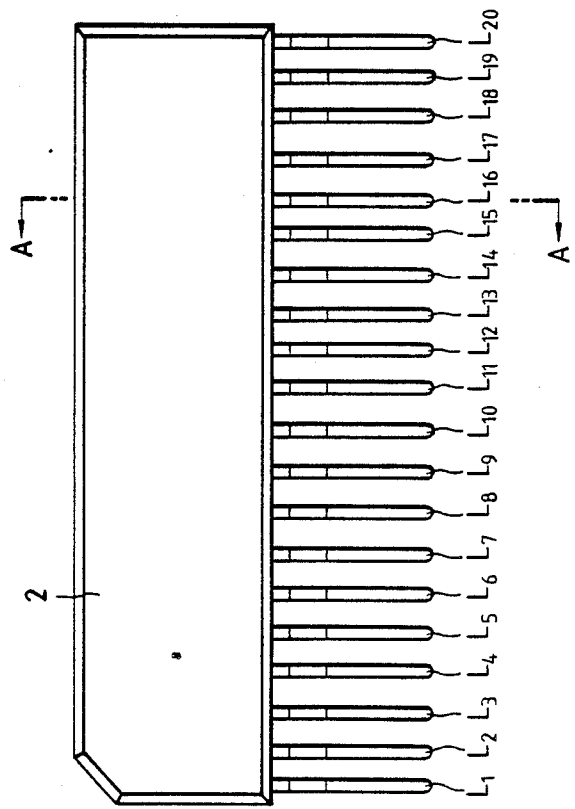
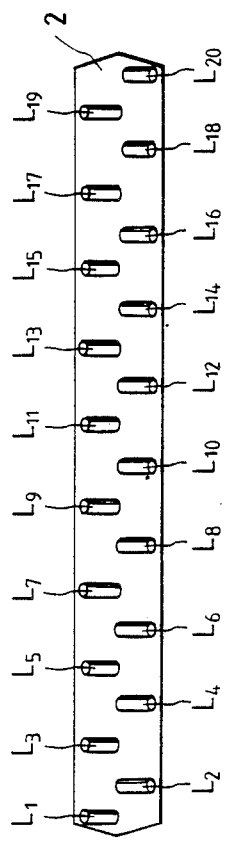

SEMICONDUCTOR DEVICE

BACKGROUND OF THE INVENTION:

The present invention relates to a semiconductor device and more particularly, to a technique which effectively allows application of a semiconductor chip (pellet) in different kinds of packages.

As a dynamic RAM (Random Access Memory) package, a dual in-line type package (DIP type package) has heretofore been mainly used for RAMs up to a 256 k-bit dynamic RAM. However, with higher integration, a package which permits a high density mounting has been desired. Consequently, also in dynamic RAMs of 1M bits or more, there is an increasing demand for packages other than DIP type packages, such as small out-line type (SOJ type) packages and zig-zag in-line type (ZIP type) packages.

SUMMARY OF THE INVENTION:

Having studied the above technique, the present inventors became aware of a problem that it was difficult for a single semiconductor chip to be applicable to a variety of packages in semiconductor chips which have an increased size as a result of an increase in capacity of dynamic RAMs. More particularly, as the chip size increases, the spacing between the side end of a package and a tab as a chip mounting portion becomes narrow. Therefore, also where the chip is applied to a different package type, there arises the problem of a narrower spacing being available between the side end of the package and a tab. As a result, the inner leads contained in the resin which forms the package become shorter, otherwise it will become impossible to completely receive the leads in the package.

In view of the above problem, the present inventors have developed a technique permitting a single semiconductor chip to be applicable to different types of packages.

The following is a brief description of typical contents of the present invention.

Bonding pads are disposed on a semiconductor chip so as to be applicable to different kinds of packages such as ZIP type package, SOJ type package and DIP type package. Further, there are used lead frames corresponding respectively to various packages.

According to the above improved developments, it is possible for a single semiconductor chip to be applicable or compatable to different kinds of packages by selecting bonding pads and a lead frame according to the kind of a package used.

Moreover, it is possible to obtain a semiconductor chip applicable to various kinds of packages by using conventional lead frames without changing the wiring other than the wiring for effecting the connection of the leads with internal circuitry of the chip or bonding pads, this being accomplished without changing the pre-existing arrangement of the bonding pads.

BRIEF DESCRIPTION OF THE DRAWINGS

FIG. 3 is a side view showing the appearance of a ZIP type package of FIG. 1;

FIG. 4 is a bottom view of the ZIP type package shown in FIG. 3;

FIG. 5 is a sectional view taken along line A—A of FIG. 3;

DESCRIPTION OF THE PREFERRED EMBODIMENTS

Figure 1:
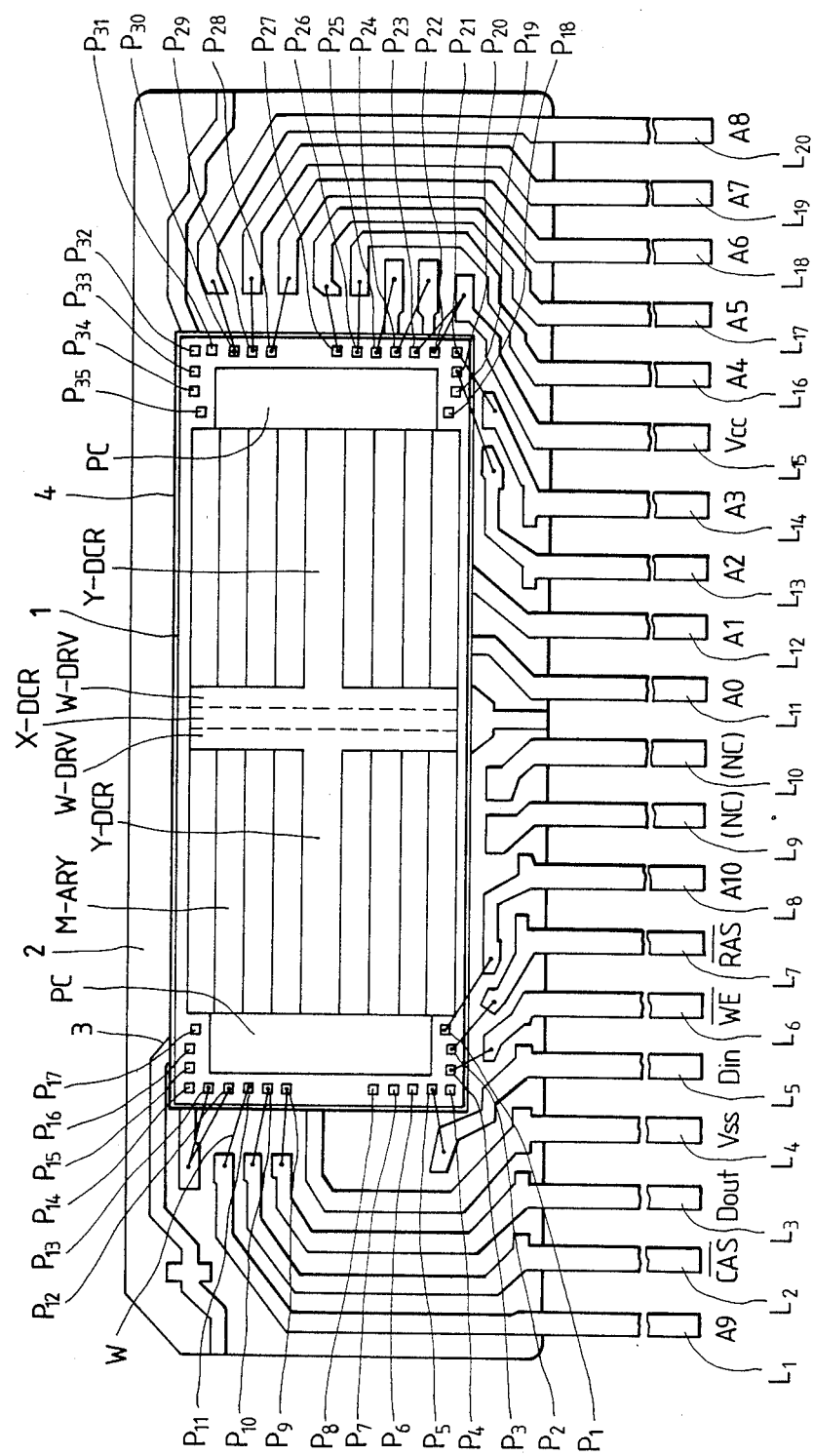
FIG. 1 is a side view showing an internal structure of a ZIP type package according to Embodiment I of the present invention.

Embodiments of the present invention will be described below specifically with reference to the accompanying drawings. In all the drawings illustrating the embodiments, the portions having the same functions are indicated by the same reference numerals. Therefore, repeated explanations thereof will be omitted.

Embodiment I

Figure 2:
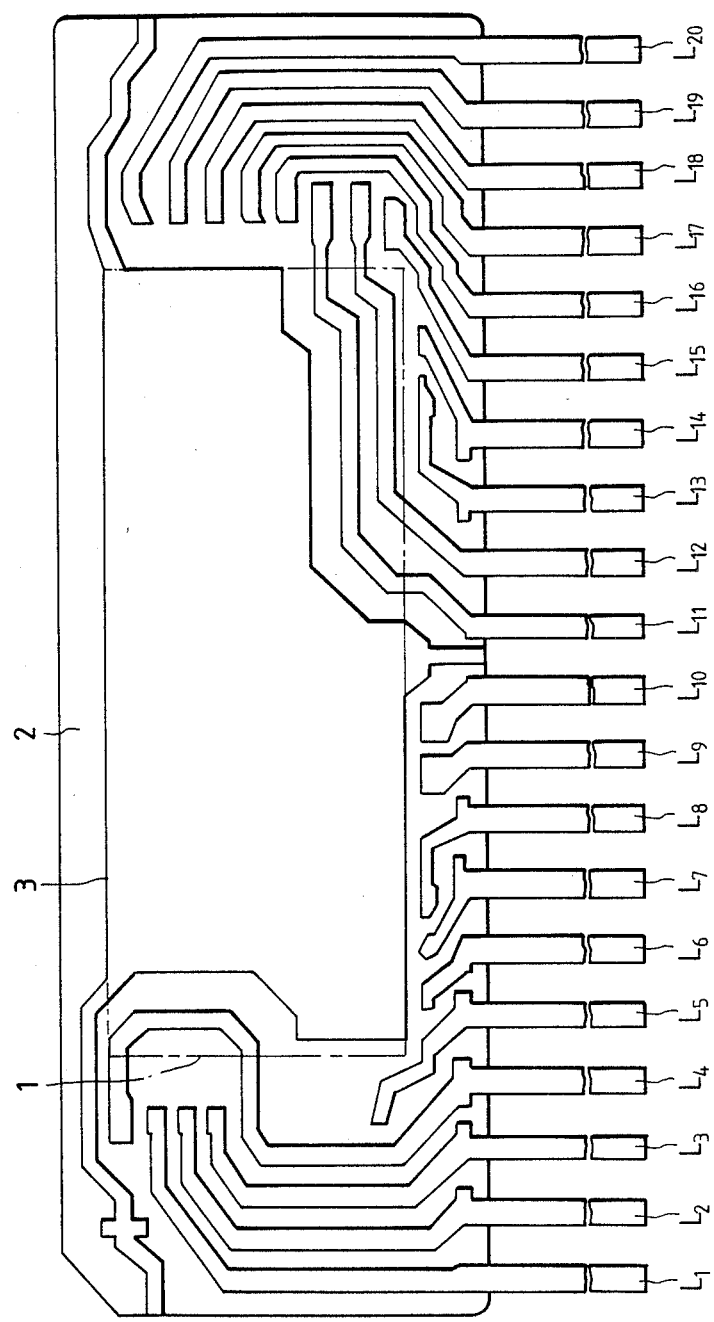
FIG. 2 is a side view showing the shape of leads in the ZIP type package of FIG. 1.

FIG. 1 is a side view showing an internal structure of a ZIP type package according to Embodiment I of the present invention; FIG. 2 is a side view showing the shape of leads used in the ZIP type package of FIG. 1; FIG. 3 is a side view showing an appearance of the ZIP type package of FIG. 1; FIG. 4 is a bottom view of the ZIP type package shown in FIG. 3; and FIG. 5 is a sectional view taken along line A—A of FIG. 3.

As shown in FIGS. 1 to 5, in the ZIP type package according to Embodiment I, a semiconductor chip 1 such as, for example, a silicon chip, which constitutes a dynamic RAM of say 4 M bits (e.g. 4 M $\times$ 1 bit construction) is sealed by resin 2. The size of this ZIP type package is 350 mil for example. The reference marks $L_1$ to $L_{20}$ denote leads. In this embodiment the number of those leads is twenty; that is, the ZIP type package according to Embodiment I is of 20 pins (the number of pins actually used, however, is 18, as will be described later). Of the leads $L_1$ to $L_{20}$, the leads $L_4$, $L_{11}$ and $L_{12}$ are distributed along the underside of the semiconductor chip 1. Thus, the lower-side area of the chip 1 is used for the wiring of the leads $L_4$, $L_{11}$ and $L_{12}$. Numeral 3 denotes a support plate for supporting the semiconductor chip 1. The chip 1 is supported in the greater part thereof by the support plate 3, but partially it is supported by the leads $L_4$, $L_{11}$ and $L_{12}$. That is, the semiconductor chip 1 is supported by both the support plate 3 and the leads $L_4$, $L_{11}$ and $L_{12}$. Thus, the ZIP type semiconductor device according to Embodiment I has been formed partially using a tabless lead frame. Further, by using the under-side area of the semiconductor chip 1 for the wiring of some leads it is made possible to reduce the package size as compared with the case where leads are disposed around a semiconductor chip using a tab.

Where the semiconductor chip 1 is supported by the support plate 3 and the leads $L_4$, $L_{11}$ and $L_{12}$, the chip 1 is mounted through an electrical insulator, for example, a polyimide-based resin sheet 4 (FIG. 5), whereby it is possible to attain electrical insulation between the support plate 3 and the leads $L_4$, $L_{11}$, $L_{12}$ and also electrical insulation among the leads $L_4$, $L_{11}$ and $L_{12}$.

As shown in FIG. 1, the semiconductor chip 1 is provided with four memory cell arrays M-ARY, X decoder X-DCR, Y decoder Y-DCR, word line driver W-DRV and peripheral circuitry PC. The memory cell arrays M-ARY are each divided into four partitions each 256k bits. The semiconductor chip 1 is provided with bonding pads $P_1$ to $P_{35}$ at short-side end portions thereof. Of these bonding pads $P_1$-$P_{35}$, the bonding pads $P_1$-$P_3$, $P_5$, $P_9$-$P_{13}$, $P_{20}$-$P_{30}$ and the leads $L_1$-$P_8$, $L_{11}$-$L_{20}$ are bonded through wires W. Thus, the semiconductor chip 1 is provided with bonding pads not actually used which are $P_4$, $P_6$-$P_8$, $P_{14}$-$P_{19}$ and $P_{31}$-$P_{35}$. These bonding pads are to be used when an SOJ type package or a DIP type package is used in place of the ZIP type package. The bonding pads $P_4$, $P_6$-$P_8$, $P_{14}$-$P_{19}$ and $P_{31}$-$P_{35}$ which are not actually used in the ZIP type package are electrically connected to the foregoing leads in the same package; that is, they have the same function as that of the bonding pads $P_1$-$P_3$, $P_5$, $P_9$-$P_{13}$ and $P_{20}$-$P_{30}$ which are actually being used. Thus, the bonding pads $P_1$-$P_{35}$ are provided on the semiconductor chip 1 so as to be applicable to packages of different types from the ZIP type package. Consequently, using the same semiconductor chip 1, the present invention is applicable to other packages than the ZIP type package. That is, when there is a demand for using a package other than the ZIP type package, the demand can be met by a mere change to the package to be used without redesigning the semiconductor chip 1.

The leads (pins) $L_1$-$L_{20}$ function as shown in FIG. 1. In the same figure, A0-A10 represent address signals, Vcc represents a supply potential, Vss an earth potential, $\overline{CAS}$ a column address strobe signal, $\overline{RAS}$ a row address strobe signal, $\overline{WE}$ a write enable signal, Dout a data output, and Din a data input. The leads $L_9$ and $L_{10}$ are not actually used, which are indicated by NC. The lead $L_{15}$ of Vcc and the bonding pads $P_{22}$, $P_{23}$ are bonded together through two wires W, and the lead $L_4$ of Vss and the bonding pads $P_{12}$, $P_{13}$ are bonded through two wires W. This is for reducing the power source impedance.

The following is an explanation of a semiconductor device assembling process using the ZIP type package of Embodiment I.

In the semiconductor device with the semiconductor chip of 4MDRAM mounted thereon according to Embodiment I, as shown in FIGS. 1-5, the insulating sheet 4 is bonded onto the support plate 3 and the inner lead portions of the leads $L_4$, $L_{11}$ and $L_{12}$, then the semiconductor chip 1 of 4MDRAM is mounted on the sheet 4. The foregoing lead frame, having such a shape as shown in FIG. 2, is formed by a copper alloy or an iron-nickel alloy. The insulating sheet 4 and the semiconductor chip 1 are mounted through an adhesive (not shown) or by pressure-bonding.

Next, the bonding portions of the leads $L_1$-$L_8$, $L_{11}$-$L_{20}$ and the bonding pads $P_1$-$P_3$, $P_5$, $P_9$-$P_{13}$, $P_{20}$-$P_{30}$ are electrically connected together through bonding wires W which are gold (Au) wires for example. The wire bonding is carried out by a wedge ball bonding method.

After the wire bonding is over, a resin-sealed type semiconductor device is completed through a conventional resin sealing step. For example, an epoxy resin is used as the sealing resin.

Embodiment II

Figure 6:
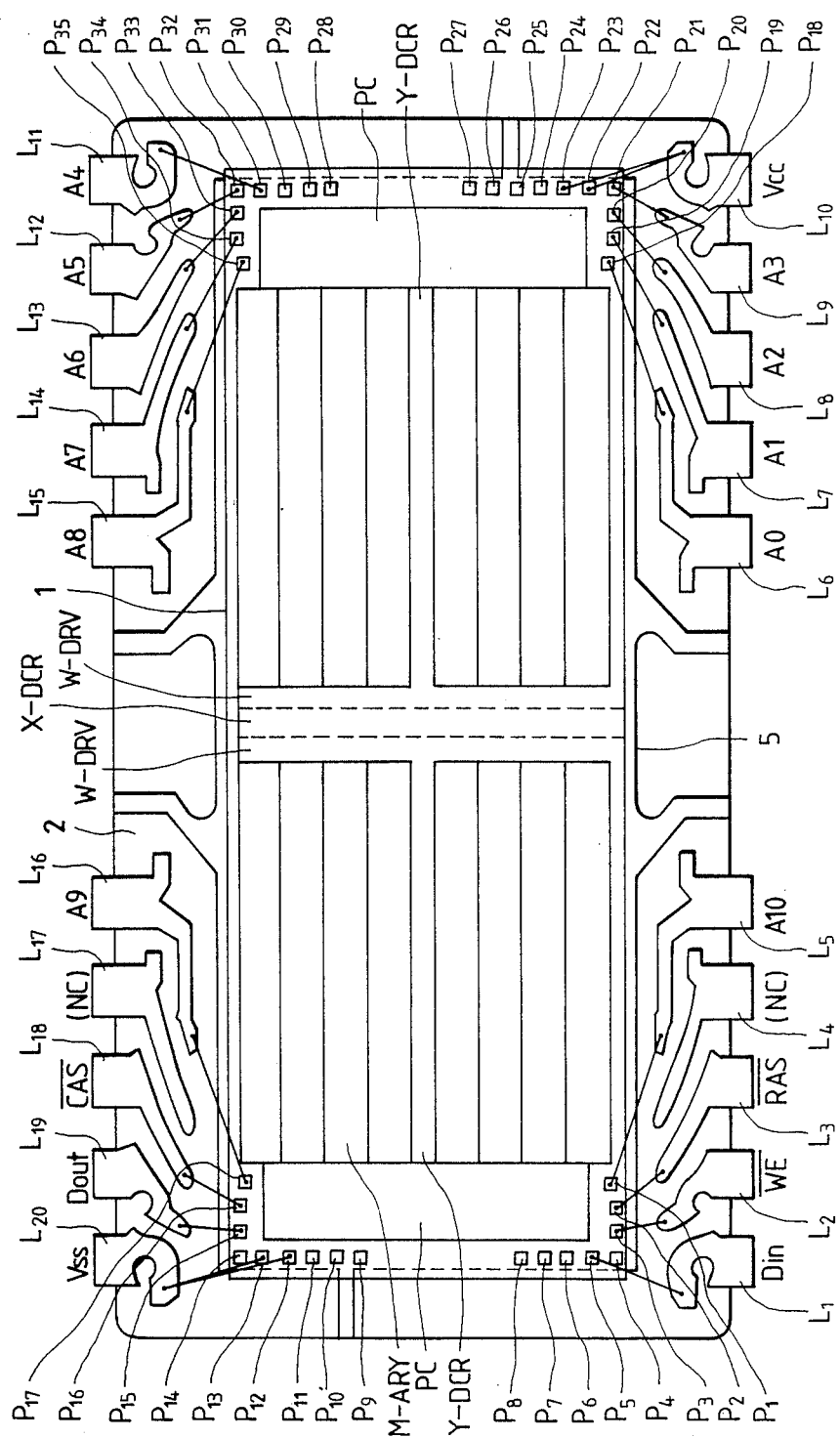
FIG. 6 is a plan view, showing an internal structure of an SOJ type package according to Embodiment II of the present invention.
Figure 7:
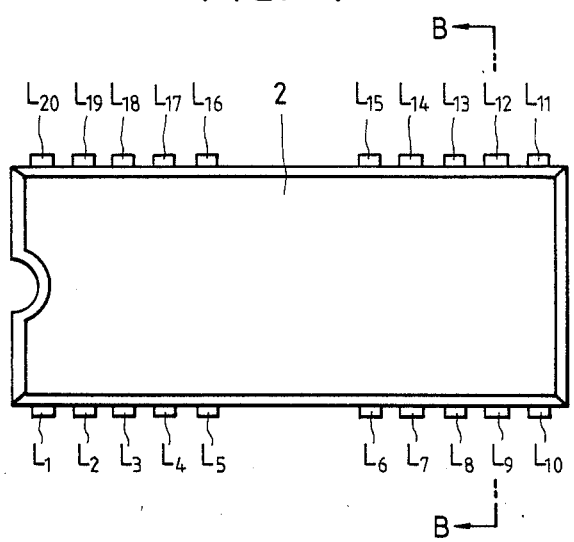
FIG. 7 is a plan view showing an appearance of the SOJ type package of FIG. 6.
Figure 8:
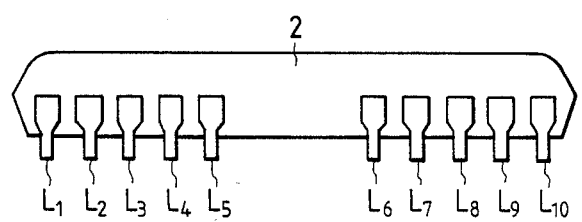
FIG. 8 is a side view of the SOJ type package shown in FIG. 7.

FIG. 6 is a plan view showing an internal structure of an SOJ type package according to Embodiment II of the present invention; FIG. 7 is a plan view showing an appearance of the SOJ type package of FIG. 6; FIG. 8 is a side view of the SOJ type package shown in FIG. 7; and FIG. 9 is a sectional view taken along line B—B of the SOJ type package shown in FIG. 7.

Figure 9:
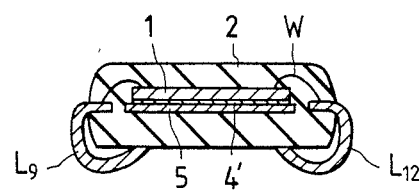
FIG. 9 is a sectional view taken along line B—B of the SOJ type package shown in FIG. 7.

In the SOJ type package according to Embodiment II, as shown in FIGS. 6 to 9, a semiconductor chip 1 similar to that used in Embodiment I is sealed by resin 2. The size of this SOJ type package is 350 mil for example. Unlike Embodiment I, leads $L_1$-$L_{20}$ have been formed using a lead frame with tab. The semiconductor chip 1 is supported by only a tab 5 which is of about the same shape as the chip. The lead frame with tab was used so that the same semiconductor chip as that used in the ZIP type package of Embodiment I could be used also in the SOJ type package. Since the semiconductor chip 1 is supported by only the tab 5, the semiconductor chip 1 is mounted directly on the tab 5 rather than through an electrical insulation sheet such as a polyimide resin sheet 4 as in Embodiment I. As shown in FIG. 9, the semiconductor chip 1 is attached to the tab through an adhesive 4'.

In this embodiment II, of the bonding pads $P_1$-$P_{35}$ provided on the semiconductor chip 1, it is $P_1$-$P_3$, $P_5$, $P_{12}$, $P_{13}$, $P_{15}$-$P_{23}$ and $P_{31}$-$P_{35}$ that are actually being used. The bonding pads $P_1$-$P_3$, $P_5$, $P_{12}$, $P_{13}$, $P_{15}$-$P_{23}$, $P_{31}$-$P_{35}$ and leads $L_1$-$L_3$, $L_5$-$L_{16}$, $L_{18}$-$L_{20}$ are bonded through wires W. The leads $L_4$ and $L_{17}$ are not used in this Embodiment II.

The semiconductor chip 1 used in this Embodiment II is the same as that used in the ZIP type package of Embodiment I and is formed with the same circuitry as that in Embodiment I. The bonding pads used here are $P_1$-$P_3$, $P_5$, $P_{12}$, $P_{13}$, $P_{15}$-$P_{22}$ and $P_{31}$-$P_{35}$. These bonding pads have been preformed on the semiconductor chip for the ZIP type package of Embodiment I, having the same function as that of the bonding pads used in the ZIP type package. The bonding pads of the semiconductor chip being used are those which correspond to the lead frame for the SOJ type package.

Thus, according to this Embodiment II, out of the bonding pads $P_1$-$P_{35}$ provided on the semiconductor chip 1 for the ZIP type package, those prepared in advance for the SOJ type package are used, whereby the SOJ type package incorporating the semiconductor chip 1 can be obtained easily without requiring the redesigning of the chip 1.

The following description is now provided with respect to a semiconductor device assembling process using the SOJ type package of Embodiment II.

As shown in FIGS. 6 to 9, the semiconductor chip is mounted on the tab 5 through the adhesive 4' which is an electroconductive material such as silver (Ag) paste for example. The foregoing lead frame is formed by a copper alloy or an iron-nickel alloy.

Then, the bonding portions of the leads $L_1$-$L_3$, $L_5$-$L_{16}$, $L_{18}$-$L_{20}$ and the bonding pads $P_1$-$P_3$, $P_5$, $P_{12}$, $P_{13}$, $P_{15}$-$P_{23}$, $P_{31}$-$P_{35}$ on the semiconductor chip are electrically connected through bonding wires W. The bonding is carried out using, for example, gold (Au) wires according to a wedge ball method.

After the wire bonding is over, leads are formed through a conventional resin sealing step, whereby a semiconductor device for an SOJ type package is completed.

Embodiment III

Figure 10:
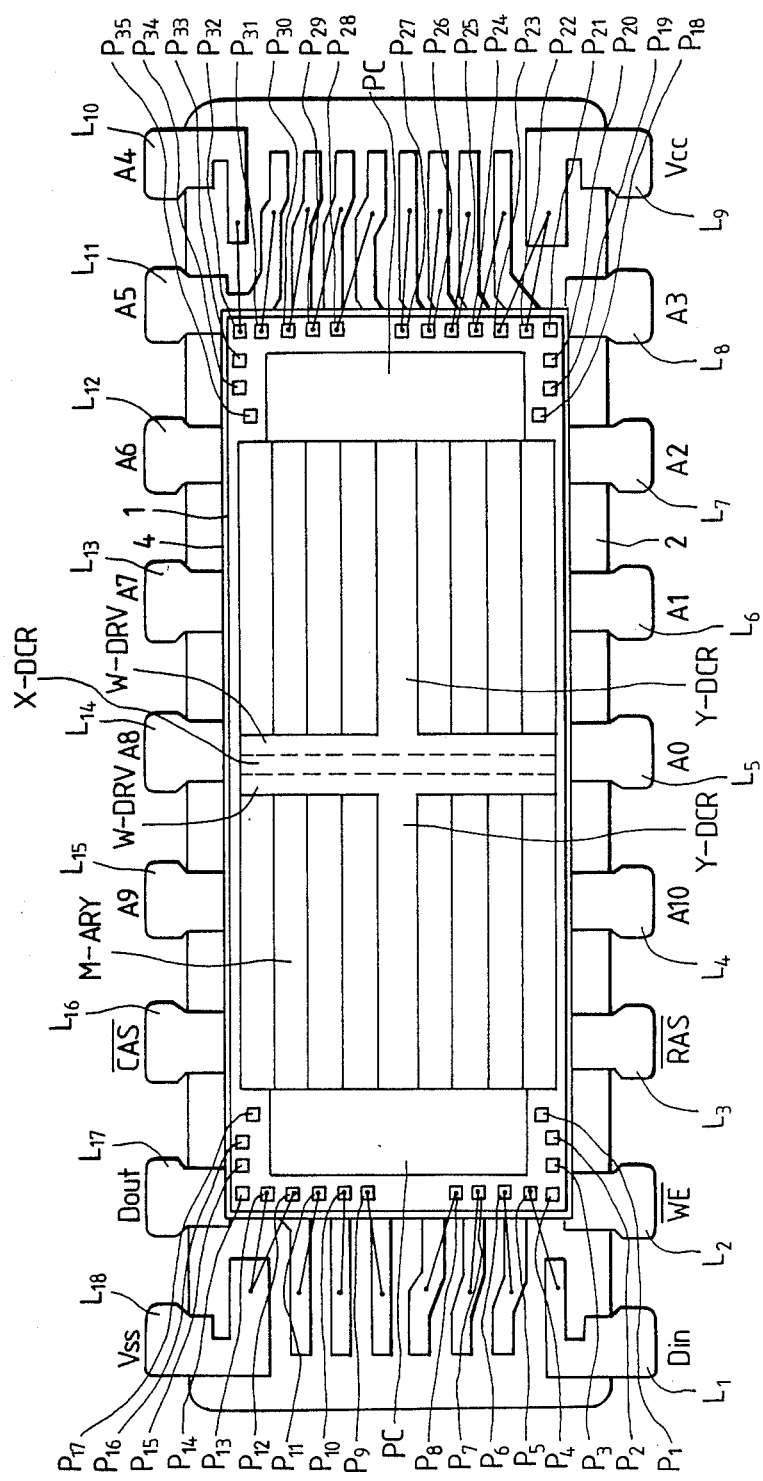
FIG. 10 is a plan view showing an internal structure of a DIP type package according to Embodiment III of the present invention.
Figure 11:
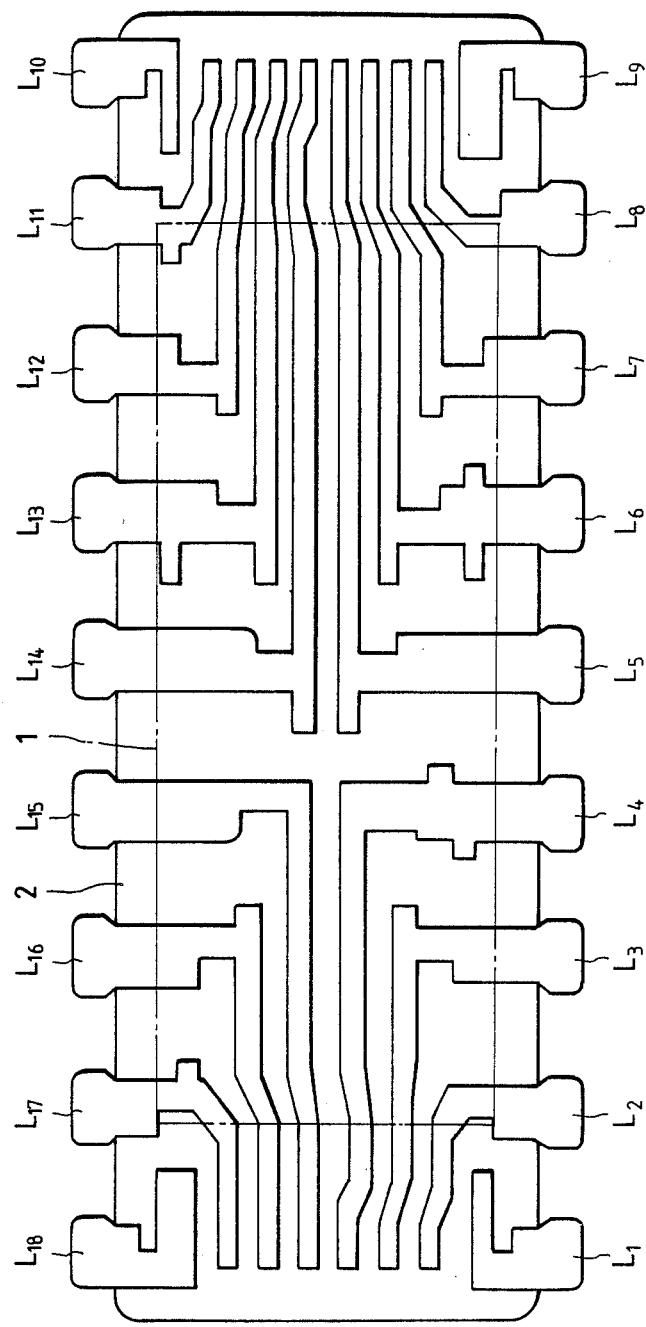
FIG. 11 is a plan view showing leads used in the DIP type package of FIG. 10.
Figure 12:
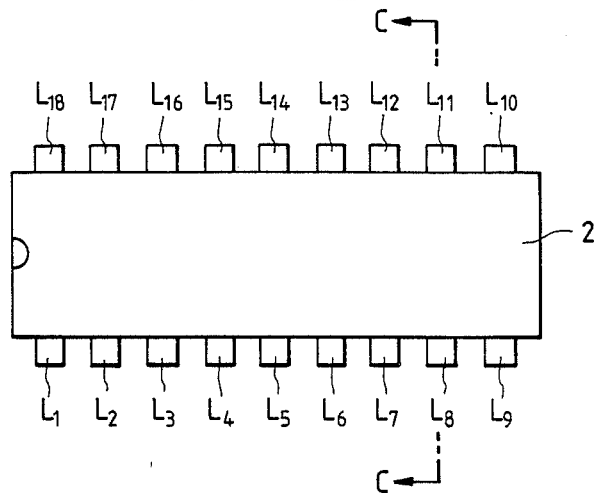
FIG. 12 is a plan view showing an appearance of the DIP type package of FIG. 10.
Figure 13:
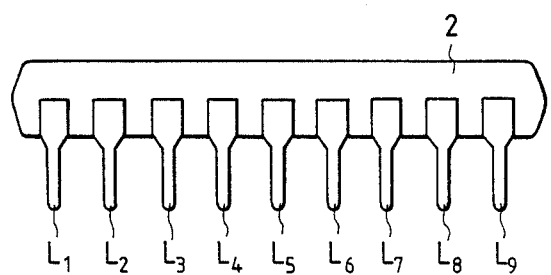
FIG. 13 is a side view of the DIP type package shown in FIG. 12.
Figure 14:
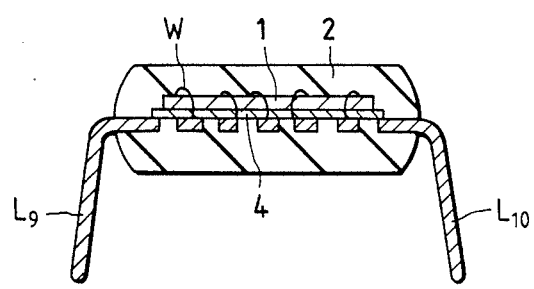
FIG. 14 is a sectional view taken along line C—C of the DIP type package shown in FIG. 12.

FIG. 10 is a plan view showing an internal structure of a DIP type package according to Embodiment III of the present invention; FIG. 11 is a plan view showing leads used in the DIP type package of FIG. 10; FIG. 12 is a plan view showing an appearance of the DIP type package of FIG. 10; FIG. 13 is a side view of the DIP type package shown in FIG. 12; and FIG. 14 is a sectional view taken along line C—C of the DIP type package shown in FIG. 12.

In the DIP type package according to Embodiment III, as shown in FIGS. 10 to 14, a semiconductor chip 1 similar to that of Embodiment I is sealed by resin 2. The size of this DIP type package is 300 mil for example. Leads $L_1$ to $L_{18}$ have been formed using a tabless lead frame in the same manner as in Embodiment I, which lead frame according to the present embodiment is a tabless lead frame for DIP type package. In this Embodiment III, unlike Embodiments I and II, the support plate 3 or the tab 5 is not provided, and the semiconductor chip 1 is supported by the leads $L_2$-$L_8$ and $L_{11}$-$L_{17}$ through sheet 4. The whole of the underside area of the chip 1 is used for the wiring of the leads $L_1$-$L_{18}$.

Of the bonding pads $P_1$-$P_{35}$ provided on the semiconductor chip 1, it is $P_5$-$P_{13}$ and $P_{22}$-$P_{32}$ that are actually being used. These bonding pads $P_5$-$P_{13}$, $P_{22}$-$P_{32}$ and the leads $L_1$-$L_{18}$ are bonded through wires W.

In this Embodiment III, in order to attain satisfactory bonding with the leads, it is necessary that the function of the bonding pads $P_9$, $P_{11}$ and $P_{24}$-$P_{32}$ be changed from that in Embodiments I and II. This functional change can be effected by changing the wiring of the final aluminum film used for the connection of the semiconductor chip 1 and the bonding pads into a wiring different from that used in the semiconductor chips for the ZIP and SOJ type packages. That is, only the function of the bonding pads is changed while their positions are kept intact. In comparison between FIGS. 1 and 10, the change in function from the bonding pads for the ZIP type package to the bonding pads for the DIP type package is performed specifically in the following manner: A0: from $P_{25}$ to $P_{27}$, A1: from $P_{24}$ to $P_{26}$, A2: from $P_{20}$ to $P_{25}$, A3: from $P_{21}$ to $P_{24}$, A4: from $P_{26}$ to $P_{32}$, A5: from $P_{27}$ to $P_{31}$, A6: from $P_{28}$ to $P_{30}$, A8: from $P_{30}$ to $P_{28}$, A9: from $P_{11}$ to $P_9$, A10: from $P_1$ to $P_8$, Dout: from $P_9$ to $P_{11}$, $\overline{WE}$: from $P_3$ to $P_6$, $\overline{RAS}$: from $P_2$ to $P_7$.

According to this Embodiment III, as can be seen from the above, by using those bonding pads which have been prepared in advance for the DIP type package out of the bonding pads $P_1$-$P_{35}$, it is possible to easily obtain a DIP type package incorporating the semiconductor chip 1 through only the change of the aluminum wiring without redesigning the other portions of the chip 1.

Moreover, the DIP type package can be obtained without changing the lead frame and without changing the internal circuitry, other than the application of the final aluminum film wiring for connection to the pre-existing the arrangement of the bonding pads.

Further, the use of a tabless lead frame permits reduction of the package size.

The assembly of the DIP package semiconductor device of Embodiment III is performed in the following manner as shown in FIGS. 10 to 14. The semiconductor chip 1 is mounted on the inner lead portions of the tabless lead frame through an insulating sheet and, using the same steps as in Embodiment I, there is completed the DIP package semiconductor device. In this case, the leads $L_1$-$L_{18}$ and the bonding pads $P_5$-$P_{13}$, $P_{22}$-$P_{32}$ are electrically connected through bonding wires W. The function of the bonding pads is changed by changing only the aluminum wiring according to a master slice method in corresponding relation to the tabless lead frame.

Although the present invention has been described above in conjunction with specific exemplifying embodiments thereof, it goes without saying that the invention is not limited to those embodiments and that various modifications may be made in the range not departing from the spirit and scope of the invention.

For example, the shape of the leads $L_1$-$L_{20}$ may be changed where required. The 4M-bit dynamic RAM constituted by the semiconductor chip 1 may be of a 4M×1-bit construction. Not only the present invention is applicable to other semiconductor integrated circuit devices than dynamic RAM's, such as static RAM's for example, but also it is possible to use other packages than the foregoing SOJ and DIP type packages, as packages of a different type from the ZIP type package. Thus, the same semiconductor chip is applicable to different types of packages.

What we claim is:

1. A semiconductor device comprising:
   a semiconductor pellet, which is formed substantially in a rectangular shape, having first and second major surfaces arranged to oppose each other, and at least one electronic device being formed on said first major surface;
   a plurality of leads, each lead having an inner portion and an outer portion, all leads are protruded outwardly from a resin sealing body and one side of said rectangular shaped semiconductor pellet, at least one first lead of said plurality of leads being positioned near a central portion of said one side, at least one second lead of said plurality of leads being positioned relatively distanced from said central portion as compared with the positioning of said first lead, a part of said first lead extending from said one side over the second major surface of said semiconductor pellet, said second lead extending at a peripheral side of said pellet which side is one of the pair of laterally adjacent sides to said one side corresponding to said rectangular shaped semiconductor pellet;
   a plurality of bonding pads arranged on the first major surface along and near both of the laterally adjacent sides of said semiconductor pellet, at least one first bonding pad of said plurality of bonding pads and at least one second bonding pad of said plurality of bonding pads being included therein, said at least one first bonding pad being disposed near one of said pair of laterally adjacent side which is further distanced from said one sides at a location thereof than is the bonding pad position of said at least one second bonding pad;

a plurality of wires electrically connected between front end tips of said inner portions and said bonding pads associated therewith;

wherein said resin sealing body has sealed therein said semiconductor pellet, said plurality of bonding pads, said plurality of bonding wires and the inner portions of said plurality of leads, said outer portions thereof extending outwardly from only one side of said resin sealing body; and wherein a part of said first lead is extended outwardly from the second major surface of said semiconductor pellet toward a position near said first bonding pad so as to facilitate an electrical connection of the front end tip of said first lead and said first bonding pad, said second lead extending toward a position near said second bonding pad so as to facilitate an electrical connection between the corresponding front end tip thereof and said second bond pad.

2. A semiconductor device according to claim 1, further comprises:

a support plate for mounting said semiconductor pellet thereon, the support plate having an area smaller than that of said semiconductor pellet, said support plate being sealed by said resin sealing body.

3. A semiconductor device according to claim 2, further comprises:

means for electrically insulating said semiconductor pellet from said support plate and from that part of said first lead extending over the second major surface of said semiconductor pellet and fixing the relative positioning of said semiconductor pellet with said support plate and said plate of said first lead.

4. A semiconductor device according to claim 3, wherein said at least one first lead includes another first lead wherein an inner portion thereof has two parts which cross over the outer edge of one of said laterally adjacent sides, a first cross over being in a direction which extends from an outer portion thereof extending inwardly toward the second surface of said semiconductor pellet and the second cross over being in a direction which extends said another first lead from over the second surface of said semiconductor pellet toward said laterally adjacent side, a front end portion thereof wherein the tip for wiring connection is located results in a second cross over of said laterally adjacent side.

5. A semiconductor device according to claim 1, wherein said at least one first lead includes another first lead wherein an inner portion thereof has two parts which cross over the outer edge of one of said laterally adjacent sides, a first cross over being in a direction which extends from an outer portion thereof extending inwardly toward the second surface of said semiconductor pellet and the second cross over being in a direction which extends said another first lead from over the second surface of said semiconductor pellet toward said laterally adjacent side, a front end portion thereof wherein the tip for wiring connection is located results in a second cross over of said laterally adjacent side.

6. A semiconductor device according to claim 1, wherein said rectangular shaped semiconductor pellet has an elongated rectangle shape and wherein said one side corresponds to one side of the pair of longer sides thereof and said laterally adjacent sides correspond to the pair of shorter sides thereof.

7. A semiconductor device according to claim 4, wherein said rectangular shaped semiconductor pellet has an elongated rectangle shape and wherein said one side corresponds to one side of the pair of longer sides thereof and said laterally adjacent sides correspond to the pair of shorter sides thereof.

8. A semiconductor device according to claim 7, wherein of said plurality of bonding pads there is included a group thereof which duplicates the function of a like number of bonding pads from said plurality of pads so that the semiconductor pellet can be readily facilitated in different types of semiconductor pellet packages without requiring rearranging the bonding pads of said pellet.

9. A semiconductor device according to claim 1, wherein of said plurality of bonding pads there is included a group thereof which duplicates the function of a like number of bonding pads from said plurality of pads so that the semiconductor pellet can be readily facilitated in different types of semiconductor pellet packages without requiring rearranging the bonding pads of said pellet.

10. A semiconductor device according to claim 6, wherein said resin sealing body has a pair of elongated opposing surfaces which are parallelly aligned with the pair of longer sides of said semiconductor pellet and wherein said plurality of leads protrude outwardly through that one of the elongated sides of said resin sealing body which is near said one side of said semiconductor pellet.

* * * * *